United States Patent
Sokolov et al.

(10) Patent No.: US 11,545,984 B2
(45) Date of Patent: Jan. 3, 2023

(54) CHARGE PUMP WITH WIDE CURRENT RANGE

(71) Applicant: SanDisk Technologies LLC, Addison, TX (US)

(72) Inventors: Gal Sokolov, Petah-Tikva (IL); Adi Berkowitz, Kfar Yona (IL)

(73) Assignee: SanDisk Technologies LLC, Addison, TX (US)

( * ) Notice: Subject to any disclaimer, the term of this patent is extended or adjusted under 35 U.S.C. 154(b) by 248 days.

(21) Appl. No.: 16/897,770

(22) Filed: Jun. 10, 2020

(65) Prior Publication Data

US 2021/0391865 A1 Dec. 16, 2021

(51) Int. Cl.
*G06F 1/10* (2006.01)
*H03L 7/089* (2006.01)
*H02M 3/07* (2006.01)
*H03L 7/099* (2006.01)
*G06F 13/16* (2006.01)
*G06F 13/42* (2006.01)

(52) U.S. Cl.
CPC .............. *H03L 7/0895* (2013.01); *G06F 1/10* (2013.01); *G06F 13/1668* (2013.01); *G06F 13/4282* (2013.01); *H02M 3/07* (2013.01); *H03L 7/099* (2013.01); *G06F 2213/0026* (2013.01); *G06F 2213/0032* (2013.01); *G06F 2213/0042* (2013.01)

(58) Field of Classification Search
CPC ......... H03L 7/0895; H03L 7/099; G06F 1/10; G06F 13/1668; G06F 13/4282; G06F 2213/0026; G06F 2213/0032; G06F 2213/0042; H02M 3/07
See application file for complete search history.

(56) References Cited

U.S. PATENT DOCUMENTS

| 7,616,035 B2* | 11/2009 | Haerle | H03L 7/0895 327/148 |
| 7,977,987 B2* | 7/2011 | Osborne | H03L 7/0816 327/158 |
| 8,179,175 B2* | 5/2012 | Tang | H03L 7/0895 327/148 |
| 9,634,561 B1* | 4/2017 | Sinha | H02M 3/07 |
| 2001/0036239 A1 | 11/2001 | Oka | |
| 2004/0004500 A1 | 1/2004 | Byun et al. | |

(Continued)

*Primary Examiner* — Henry Tsai
*Assistant Examiner* — Harry Z Wang
(74) *Attorney, Agent, or Firm* — Vierra Magen Marcus LLP

(57) ABSTRACT

A charge pump has a first branch that includes a first node connected between a first pull-up switch and a first pull-down switch and a second branch that includes a second node connected between a second pull-up switch and a second pull-down switch. The second branch is connected in parallel with the first branch. The charge pump has a voltage equalization circuit to equalize a first voltage at the first node and a second voltage at the second node. A third branch includes a third node that is connected between a third pull-up switch and a third pull-down switch. The third node is connected to the second node. The third pull-up switch and the first pull-up switch are controlled by a common pull-up signal. The third pull-down switch and the first pull-down switch are controlled by a common pull-down signal.

24 Claims, 15 Drawing Sheets

(56) References Cited

U.S. PATENT DOCUMENTS

| | | | |
|---|---|---|---|
| 2004/0212410 A1 | 10/2004 | Ghazali et al. | |
| 2015/0200588 A1* | 7/2015 | Cheng | H03L 7/0895 |
| | | | 327/536 |
| 2015/0288355 A1* | 10/2015 | Lau | H03K 17/102 |
| | | | 327/333 |

* cited by examiner

CHARGE PUMP WITH WIDE CURRENT RANGE

BACKGROUND

Charge pumps are used for various purposes in Integrated Circuits (ICs). A charge pump may be used to raise or lower voltage (e.g. to provide a DC output that is higher than a DC input), to drive current in a circuit, or for other purposes. ICs that use charge pumps may include ICs used in memory systems.

Many electronic devices make use of memory systems. Often, the memory system includes non-volatile memory such as flash memory. An electronic device that includes a memory system, or is connected to a memory system, is often referred to as a host.

A memory system that includes semiconductor memory may be in communication with a host through an interface. In some cases, more than one data storage device may be in communication with a host system through one or more interfaces. Various standardized interfaces may be used for communication between components including data storage devices and a host system, including Peripheral Component Interface (PCI), PCI express (PCIe), Serial ATA (SATA), Serial Attached SCSI (SAS), Non-Volatile Memory Host Controller Interface Specification (NVMHCIS) or Non-Volatile Memory Express (NVMe), and other interfaces.

BRIEF DESCRIPTION OF THE DRAWINGS

Like-numbered elements refer to common components in the different figures.

DETAILED DESCRIPTION

In some examples of the present technology, a current steering charge pump is configurable to supply a wide range of output currents with good stability. Such a charge pump may include a voltage equalization circuit (e.g. an op-amp configured in a voltage follower configuration) to equalize voltage between nodes of two branches of the charge pump (e.g. between an output node and an internal node). In addition, a third branch may be coupled to the internal node to provide current through the internal node. This allows the use of a relatively low current/power op-amp with a wide range of different charge pump current outputs. For example, such an op-amp may use a current source with a fixed, relatively low current output while the first and second branches share configurable current sources capable of generating relatively large currents and the third branch also has configurable current sources to match those of the first and second branches. Current sources may be configurable so that the charge pump may generate current at a desired current level from a range of possible voltage levels. Such configuration may not require reconfiguration of the op-amp, which may use the same current regardless of the configured charge pump current.

Figure 1:
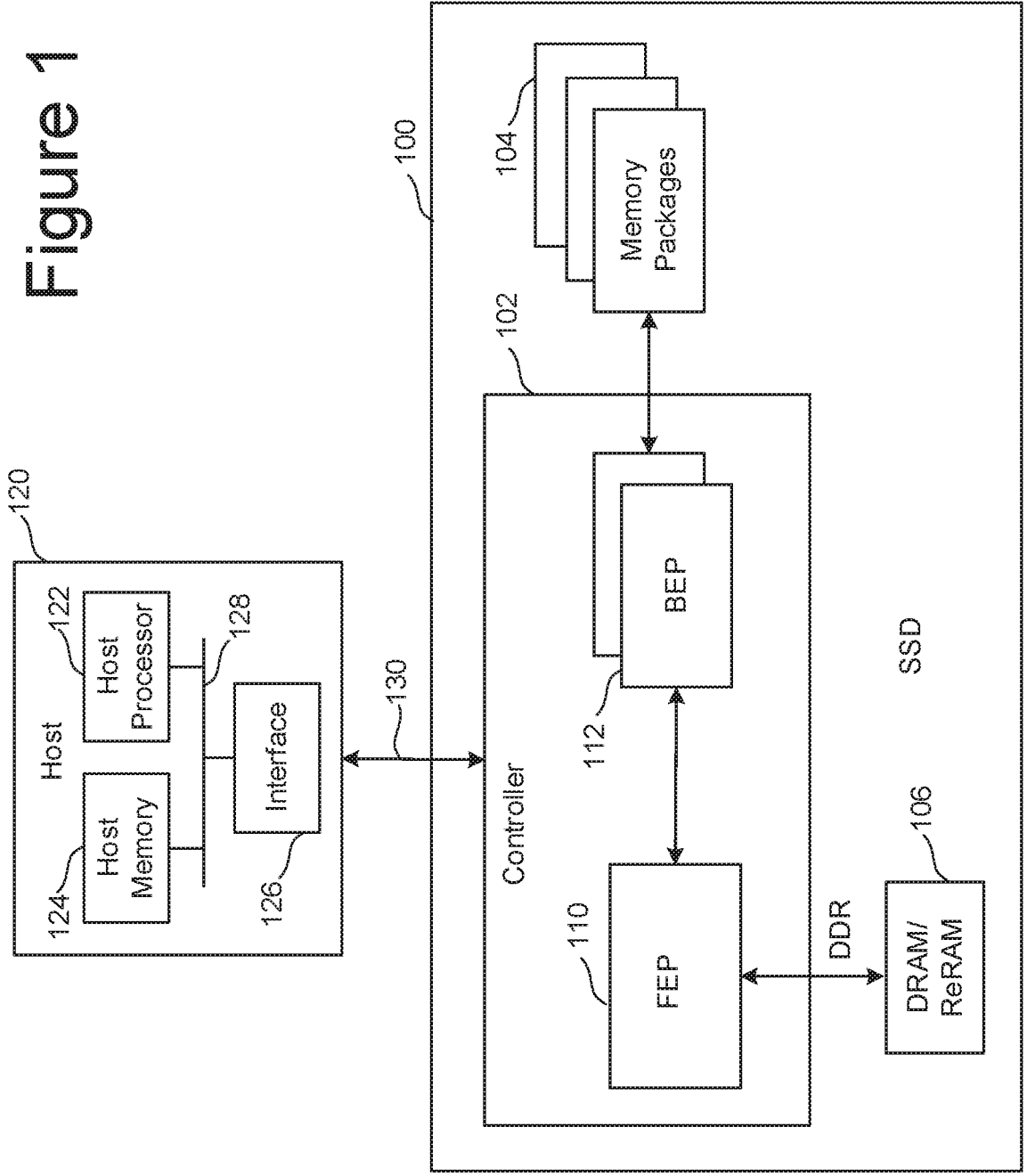
FIG. 1 is a block diagram of one embodiment of a memory system connected to a host.

FIG. 1 is a block diagram of one embodiment of a memory system 100 connected to a host 120. Memory system 100 can implement the technology proposed herein. Many different types of memory systems can be used with the technology proposed herein. One example memory system is a solid state drive ("SSD"). Memory system comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two dimensional NAND flash memory and/or three dimensional NAND flash memory). In other embodiments, the memory package can include other types of memory.

Controller 102 communicates with host 120 via an interface 130 that may operate according to an interface protocol. For example, interface 130 may use Peripheral Computer Interconnect (PCI), PCI express (PCIe), Serial AT Attachment (SATA), Universal Serial Bus (USB) or other interface protocol. For working with memory system 100, host 120 includes a host processor 122, host memory 124, and an interface circuit 126 (e.g. using PCI, PCIe, SATA, USB, or other protocol according to interface 130). Host memory 124 is the host's physical memory, and can be DRAM, SRAM, non-volatile memory or another type of storage. Host 120 is external to and separate from memory system 100 (e.g., an SSD). In one embodiment, memory system 100 is embedded in host 120.

Figure 2:
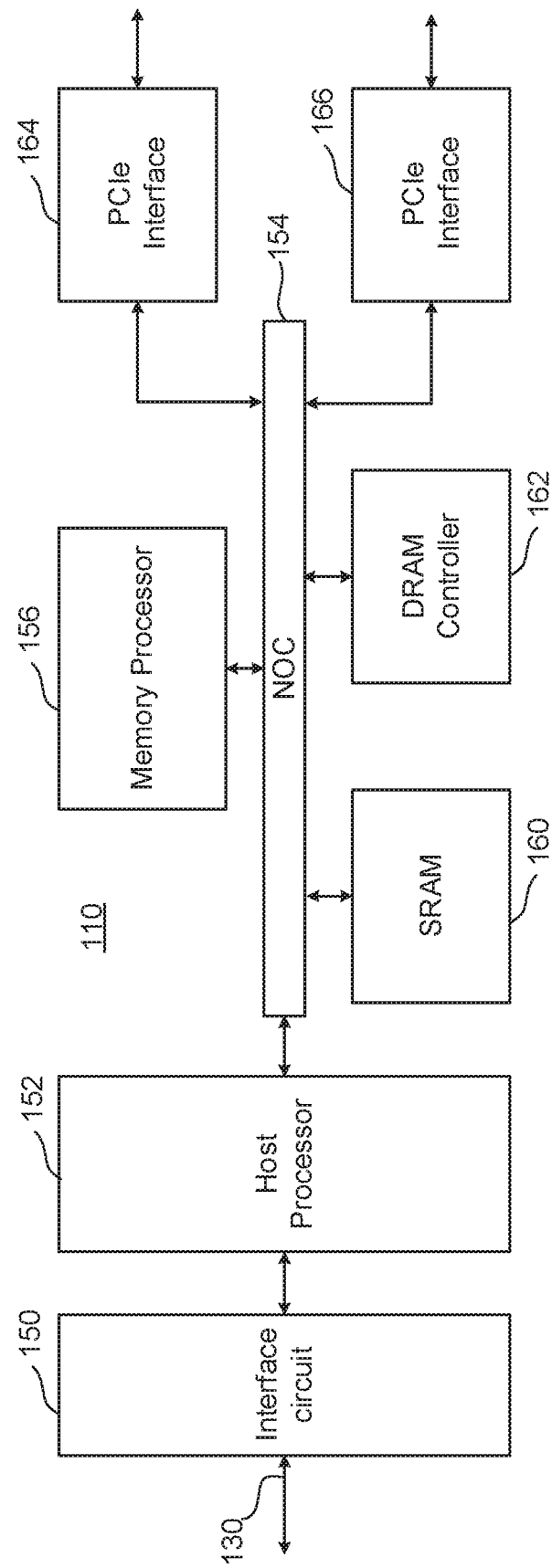
FIG. 2 is a block diagram of one embodiment of a Front End Processor Circuit. The Front End Processor Circuit is part of a Controller.

FIG. 2 is a block diagram of one embodiment of FEP circuit 110. FIG. 2 shows an interface circuit 150 to communicate with host 120 over interface 130 and shows a host processor 152 in communication with interface circuit 150. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
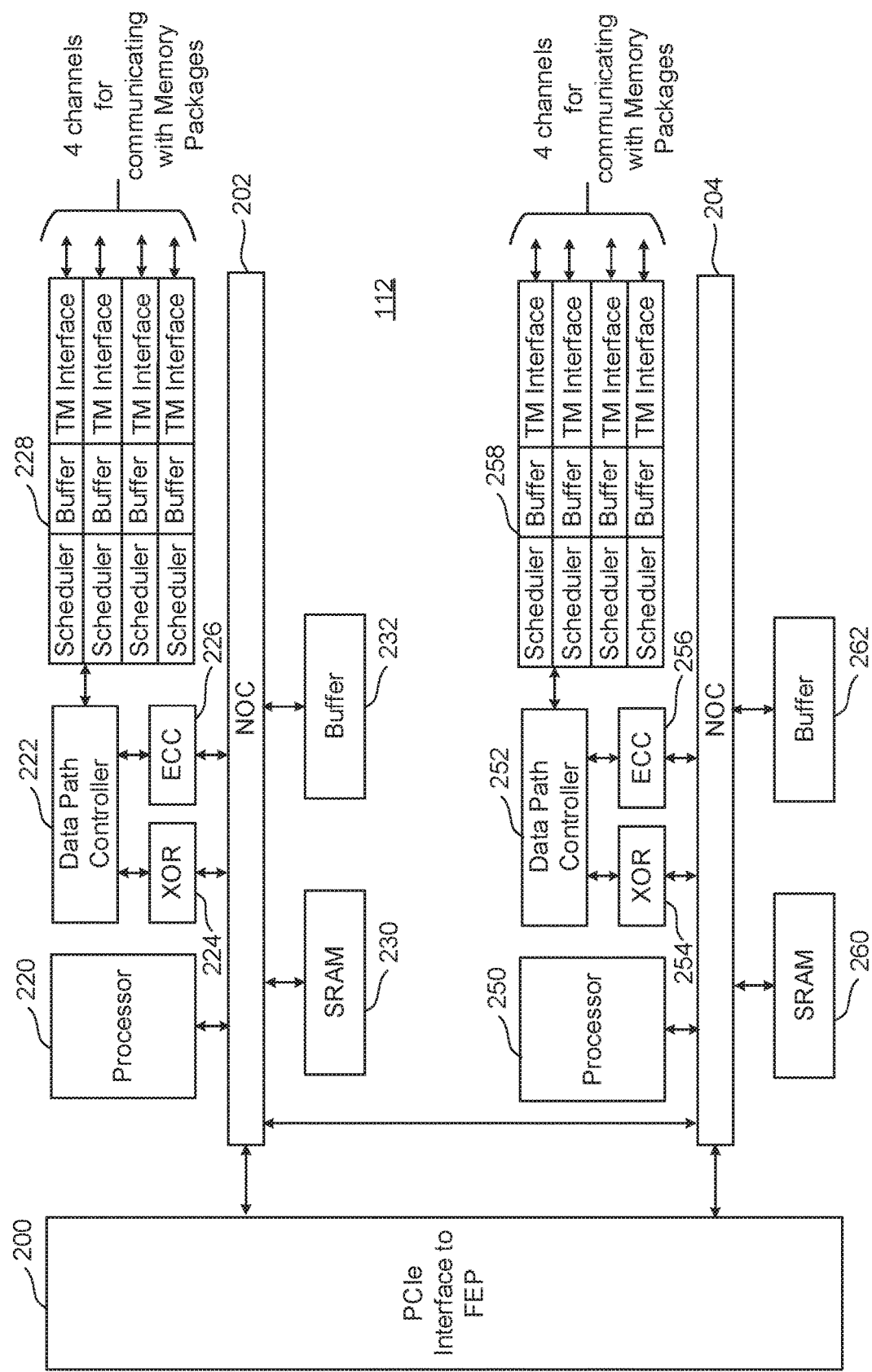
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
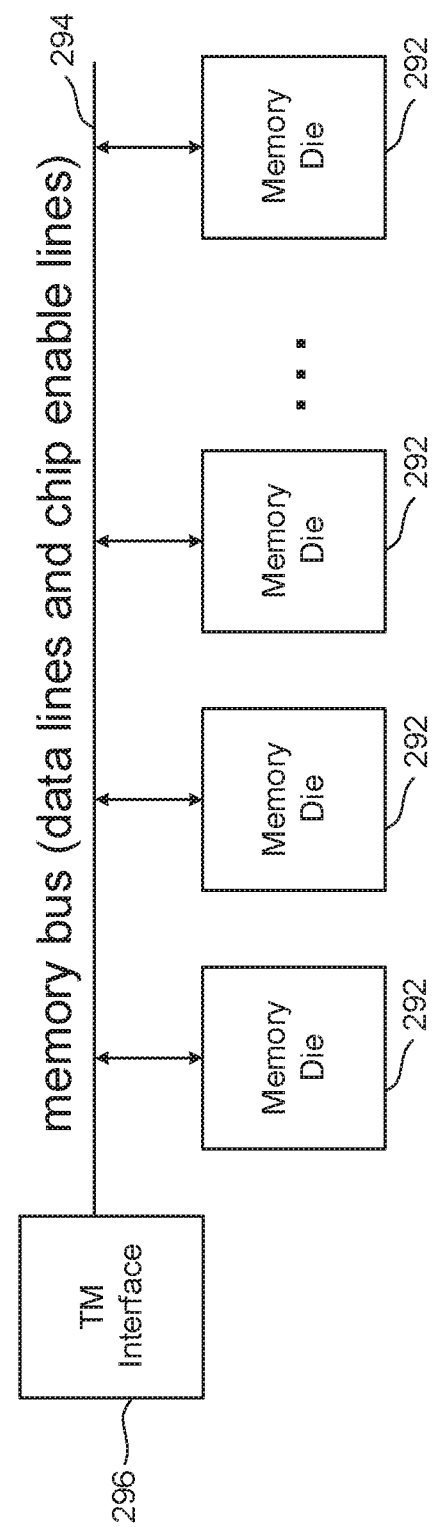
FIG. 4 is a block diagram of one embodiment of a memory package.

FIG. 4 is a block diagram of one embodiment of a memory package of non-volatile memory 104 that includes a plurality of memory die 292 connected to a memory bus 294 (data lines and chip enable lines). The memory bus 294 connects to a Toggle Mode Interface 296 for communicating with the TM Interface of a BEP circuit 112 (see e.g. FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
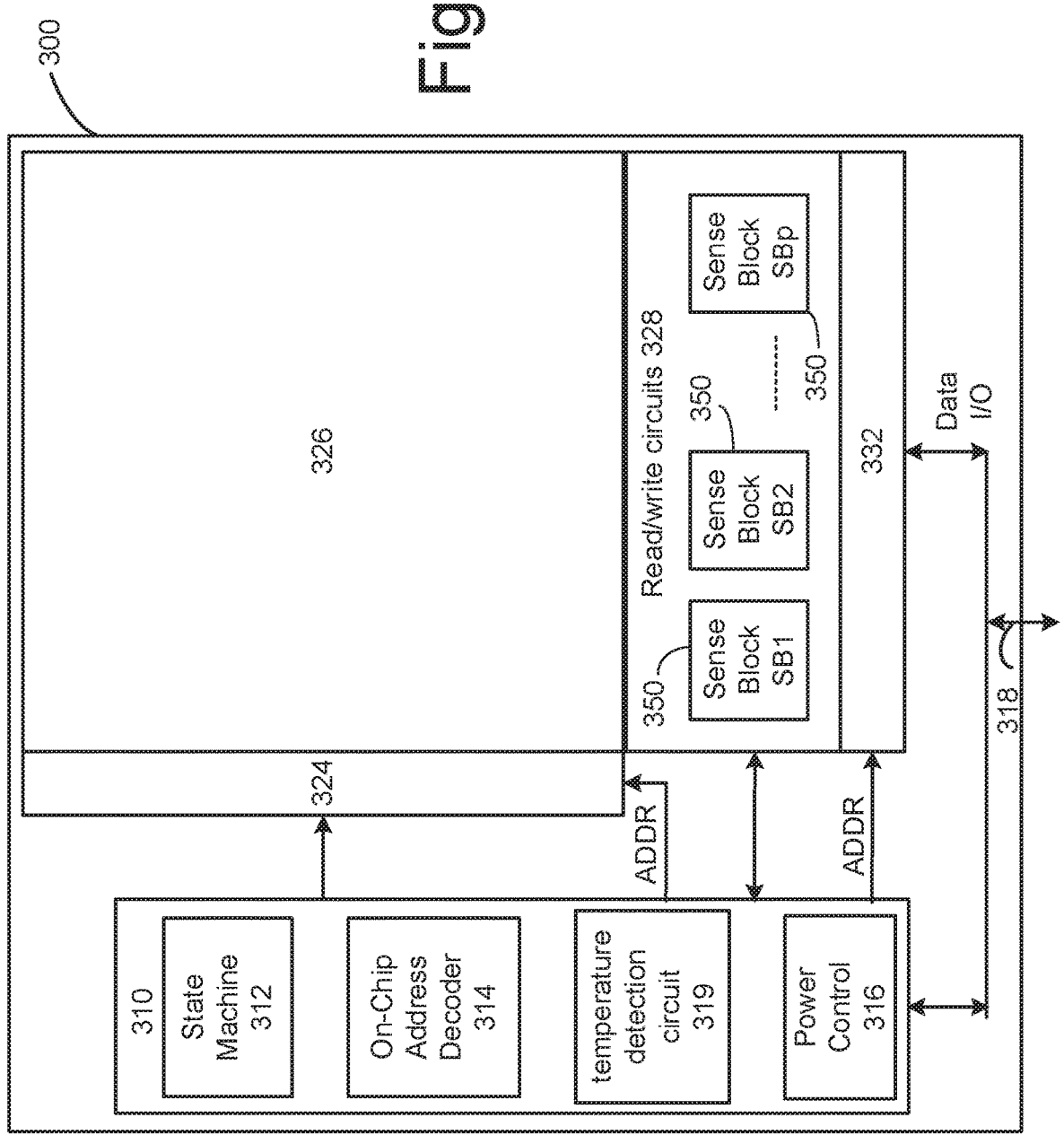
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller and the memory die 300 via lines 318. In one embodiment, memory die 108 includes a set of input and/or output (I/O) pins that connect to lines 118.

Control circuitry 310 cooperates with the read/write circuits 328 to perform memory operations (e.g., write, read, and others) on memory structure 326, and includes a state machine 312, an on-chip address decoder 314, a power control module 316 (power control circuit) and a temperature detection circuit 319. State machine 312 provides die-level control of memory operations. In one embodiment, state machine 312 is programmable by software. In other embodiments, state machine 312 does not use software and is completely implemented in hardware (e.g., electrical circuits). In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

In one embodiment, the control circuit(s) are formed on a first die, referred to as a control die, and the memory array is formed on a second die, referred to as a memory die. For example, some or all control circuits (e.g. control circuitry 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g. one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 6A:
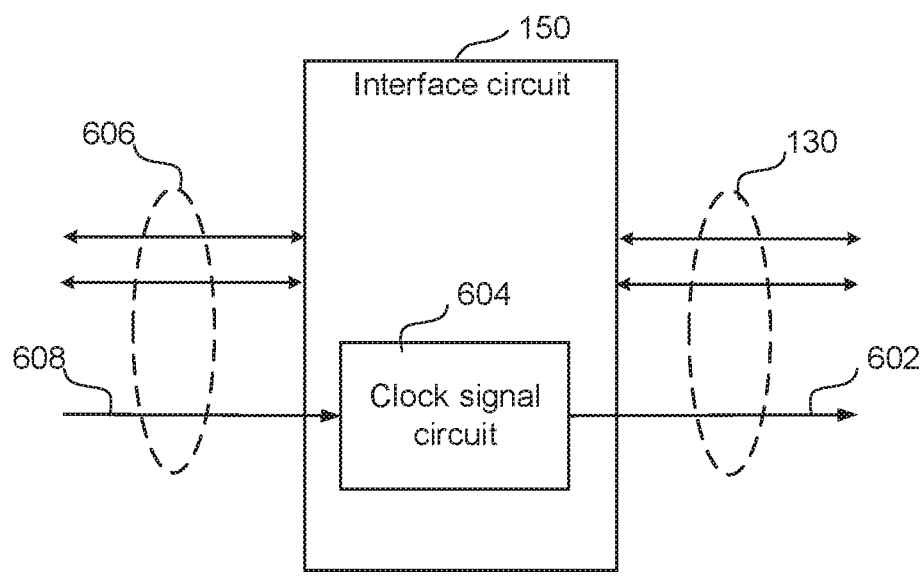
FIG. 6A illustrates an example of an interface circuit.

As shown in FIG. 2, FEP 110 includes interface circuit 150 for communication over interface 130 with corresponding interface circuit 126 in host 120. FIG. 6A shows an example of interface circuit 150 including interface 130, which includes a plurality of individual lines that each include separate electrically conductive components (e.g. separate pins and traces/wires). Interface 130 may include one or more line to supply a fixed reference voltage (e.g. ground). Interface 130 may include one or more line to provide power through interface 130 (e.g. power from host 120 to memory system 100). Interface 130 may include one or more data lines that are dedicated to communication of data between host 120 and memory system 100 (e.g. serial communication). FIG. 6A shows that interface 130 includes clock line 602, which conveys a clock signal over interface 130. For example, in some communication or interface protocols, a clock signal is sent along with one or more data signals so that a receiving circuit can use the clock signal for sampling a data signal when it is received.

In addition to interface 130, which connects interface circuit 150 with host 120, interface circuit 150 is connected to other components of controller 102 (e.g. other components of FEP 110 including host processor 152) through internal interface 606. Internal interface 606 may include lines for power, reference voltages (e.g. ground), data and/or other purposes. FIG. 6A shows that internal interface 606 includes reference clock line 608, which may be configured to provide a reference clock to interface circuit 150. For example, a reference clock signal may be generated by a clock located elsewhere in memory system 100 (e.g. in host processor 152 or in a dedicated clock circuit) and may be sent to interface circuit 150 over reference clock line 608. A reference clock signal may be sent to more than one component in a die so that multiple components use a common clock signal (e.g. a global clock signal). Reference clock line 608 may convey a common clock signal (shared with one or more other components) or a dedicated clock signal (e.g. generated by a clock that does not provide a clock signal to any other components).

Interface circuit 150 includes clock signal circuit 604, which is connected to receive a reference clock signal on reference clock line 608. Clock signal circuit 604 is connected to produce a clock signal on clock line 602 of interface 130. In an example, clock signal circuit 604 uses a reference clock signal received on reference clock line 608 to generate a clock signal that is sent on clock line 602.

In some cases, an interface such as interface 130 may operate using a clock speed that is higher than a clock speed used in circuits on one or both sides of the interface. For example, to facilitate high speed transfer of data between host 120 and memory system 100, a clock signal provided on clock line 602 may be at a higher frequency than a clock signal used in memory system 100 (e.g. higher than the frequency of a reference clock signal received on reference clock line 608).

Figure 6B:
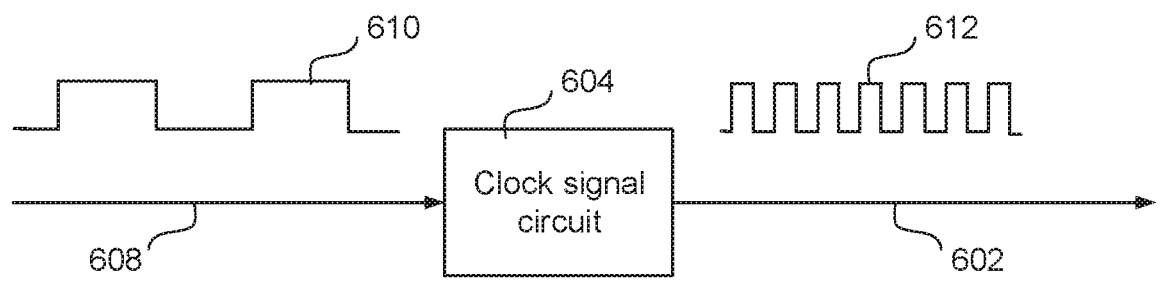
FIG. 6B illustrates an example of a clock signal circuit.

FIG. 6B shows an example of clock signal circuit 604 receiving reference clock signal 610 on reference clock line 608 at a first (reference) frequency and providing clock signal 612 on clock line 602 at a second frequency that is higher than the first frequency. For example, the frequency of clock signal 612 may be a multiple of the frequency of reference clock signal 610. Clock signal circuit 604 may operate as a clock multiplier to generate clock signal 612 from reference clock signal 610. Different interface standards (e.g. PCI, PCIe, SATA, USB, or other interface standards) may use different clock speeds (frequencies) and may have different requirements for clock signals (amplitudes, duty cycles, etc.) In order to accommodate such different requirements, interface circuits may be configurable to generate different clock signals from a reference clock signal. For example, clock signals of 6 GHz, 8 GHz, 10 GHz and/or other high frequencies may be generated from a 25 MHz reference clock signal according to configuration.

In an example, clock signal circuit 604 may include a Phase Locked Loop (PLL) configured to act as a clock multiplier. Such a PLL may facilitate interfacing with different hosts using different clock signals (e.g. different signals according to different interface standards).

Figure 7:
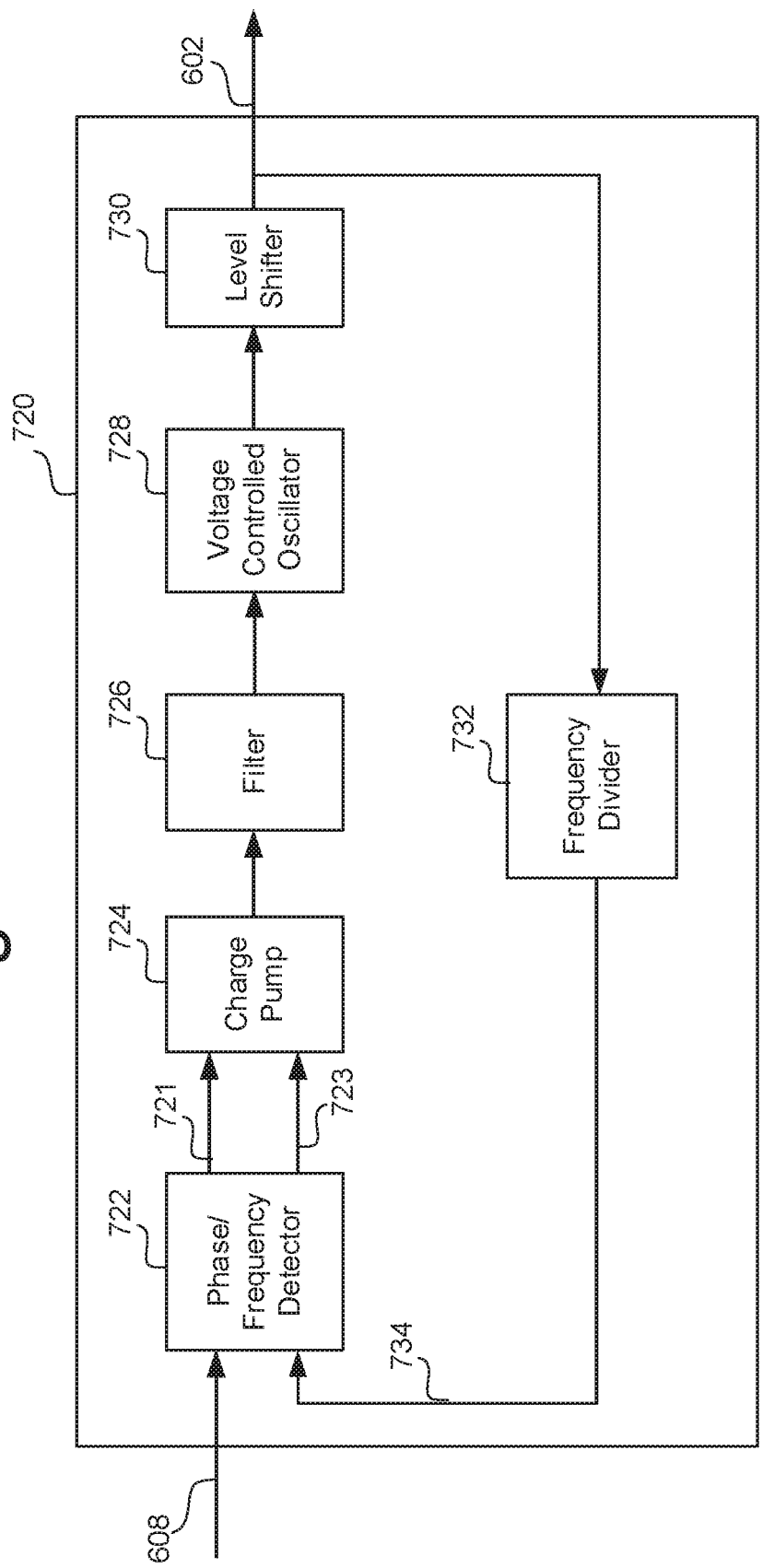
FIG. 7 illustrates an example of a Phase Locked Loop (PLL).

FIG. 7 shows an example of a PLL 720 configured to act as a clock multiplier (e.g. configured as a clock multiplier of clock signal circuit 604). PLL 720 includes Phase/Frequency Detector (PFD) 722, charge pump 724, filter 726, Voltage Controlled Oscillator (VCO) 728, level shifter 730 and frequency divider 732. PLL 720 receives a reference clock signal on reference clock line 608 (e.g. in the form of square waves with reference frequency $f_{ref}$), from a reference frequency source, not shown, which may be a crystal oscillator which generates a low jitter or low phase noise reference signal at a known frequency.

PFD 722 has two input terminals, the reference clock line 608, which carries a reference clock signal and the feedback input 734. Feedback input 734 is generated by frequency divider 732 from the output signal of level shifter 730 (e.g. from a clock signal output on clock line 602). Frequency divider 732 divides the frequency of the clock signal by a predetermined value so that feedback input 734 provides a divided frequency signal with a frequency that is a predetermined fraction of the output clock signal.

PFD 722 outputs an "up" signal on line 721 and a down ("dn") signal on line 723 (PFD output signal). When the phase of the reference clock signal on reference clock line 608 leads the feedback signal on feedback input 734, PFD 722 outputs longer up pulses on line 721 and shorter down pulses on line 723 (e.g. provides digital pulses on lines 721, 723) with pulse width proportional to phase difference). When the phase of the feedback signal on feedback input 734 leads the reference clock signal on reference clock line 608, PFD 722 outputs longer down pulses and shorter up pulses. The duration difference of up and down pulses equals the phase difference of the reference clock signal on reference clock line 608 and the feedback signal on feedback input 734.

Charge pump 724 is an analog circuit controlled by inputs from PFD 722 (up signal on line 721 and down signal on line 723), which acts in response to an indication of a phase difference between signals supplied by reference clock line 608 and signals supplied by the frequency divider 732 on feedback input 734. Charge pump 724 generates phase error correction current pulses based on the up/down pulses provided by PFD 722, in order to pull the input voltage of VCO 728 (VCO input voltage) up or down to adjust the frequency of the VCO output signal. A charge pump circuit may contain a current source and a current sink to pull the output voltage of the charge pump up or down, respectively, by providing appropriate current to an input of filter 726.

Filter 726 (e.g. loop filter) smoothes the output from charge pump 724 and determines the loop performance, based upon selected loop filter elements. The output of the filter 726 adjusts the input voltage of VCO 728 and determines the frequency of the output signal of VCO 728 and thus the output frequency of PLL 720 on clock line 602. The output signal of VCO 728 is provided to level shifter 730, which amplifies the signal from VCO 728 to full-swing (e.g. without changing frequency). The output of level shifter 730 is then provided on clock line 602 (e.g. as the interface clock signal) and is fed back to frequency divider 732, where it is divided and used as a reference signal by PFD 722.

PLL 720 produces a clock signal on clock line 602 with a frequency that is a multiple of the reference clock signal received on reference clock line 608, where the multiple is determined by frequency divider 732. The phase of the clock signal on clock line 602 follows the phase of the reference clock signal received on reference clock line 608. Therefore, the feedback of PLL 720 provides a means for locking the phase and frequency of the clock signal to the reference clock signal and for generating a higher frequency clock signal from a lower frequency reference clock signal. In this way, a high frequency clock signal that is suitable for high speed communication over an interface may be generated from a reference clock signal that has a lower frequency (e.g. from a clock signal used internally in an IC such as a controller die).

Figure 8A:
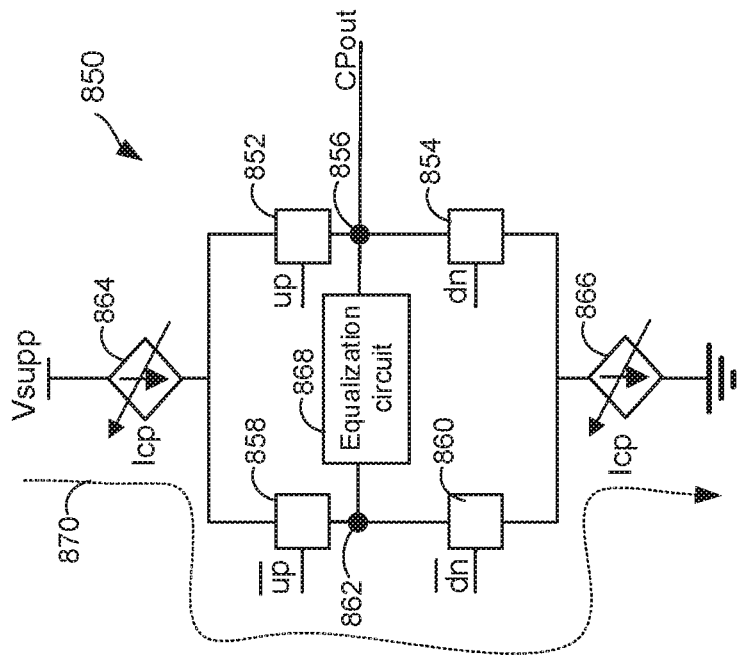
FIGS. 8A-D illustrate examples of operation of a current steering charge pump.

An example of a charge pump 850 is shown in FIG. 8A. For example, charge pump 724 in PLL 720 in interface circuit 150 may be implemented by charge pump 850. Charge pump 850 has two branches, each with a respective pull-up switch and a pull-down switch to pull the voltage at a node between the pull-up and pull-down switches either up or down. Switches, including pull-up switches and pull-down switches may be implemented by transistors (e.g. PMOS or NMOS transistors) that are controlled by a voltage applied to their gate or by other suitable switching components. A first branch includes a first pull-up switch 852 that is controlled by an up signal ("up") that may be received on up signal line 721 from PFD 722. The first branch also includes a first pull-down switch 854 that is controlled by a down signal ("dn") that may be received on down signal line 723 from PFD 722. The up signal and down signal may provide one of two inputs at any time (e.g. two voltage levels) to turn switches on/off (e.g. a first/low/off input and a second/high/on input). Between first pull-up switch 852 and first pull-down switch 854, a first node 856 is connected to provide the charge pump output current of charge pump 850 ("CPout"), e.g., through filter 726 to VCO 728. First node 856 may be considered an output node of charge pump 850. The voltage of first node 856 may be pulled up or down according to signals received on up signal line 721 and down signal line 723 (representing phase differences detected by PFD 722) to thereby change the voltage input to VCO 728.

A second branch includes second pull-up switch 858 that is controlled by the inverse of the up signal ("$\overline{UP}$") provided to first pull-up switch 852 (e.g. the inverse of a signal received on up signal line 721 from PFD 722). The second branch also includes a second pull-down switch 860 that is controlled by the inverse of the down signal ("$\overline{dn}$") provided to first pull-down switch 854 (e.g. the inverse of the signal received on down signal line 723 from PFD 722). Between second pull-up switch 858 and second pull-down switch 860 is a second node 862 (internal node). The first and second branches are connected in parallel with current sources configured to drive the same current at common connections on either end of the first and second branches. A first current source 864 is connected to a supply voltage ("Vsupp") and is configured to supply a current ("Icp") for either branch of charge pump 850. First current source 864 is connected to first pull-up switch 852 and second pull-up switch 858 so that current from first current source 864 may go to either branch of charge pump 850. A second current source 866 is connected between the first and second branches of charge pump 850 and ground to sink current from either branch. Second current source 866 is connected to first pull-down switch 854 and second pull-down switch 860 to sink current from either branch. Second current source is configured to sink the same current ("Icp") as supplied by first current source 864. It will be understood that a current source may "sink" current at a node by providing a current that flows away from the node and that the term "current source" is not limited to a circuit that generates current flow towards a node but also includes such a circuit generating current flow away from the node.

Equalization circuit 868 is connected to first node 856 and second node 862. Equalization circuit is configured to equalize voltage at first node 856 and second node 862. For example, as first node 856 is pulled up by first pull-up switch 852, equalization circuit 868 may provide current at second node 862 to increase the voltage at second node 862 according to the voltage at first node 856. Providing current in this way may act to stabilize charge pump 850 by compensating for current flowing out of charge pump 850 at first node 856 and allowing first current source 864 and second current source 866 to operate in a stable manner.

Figure 8B:
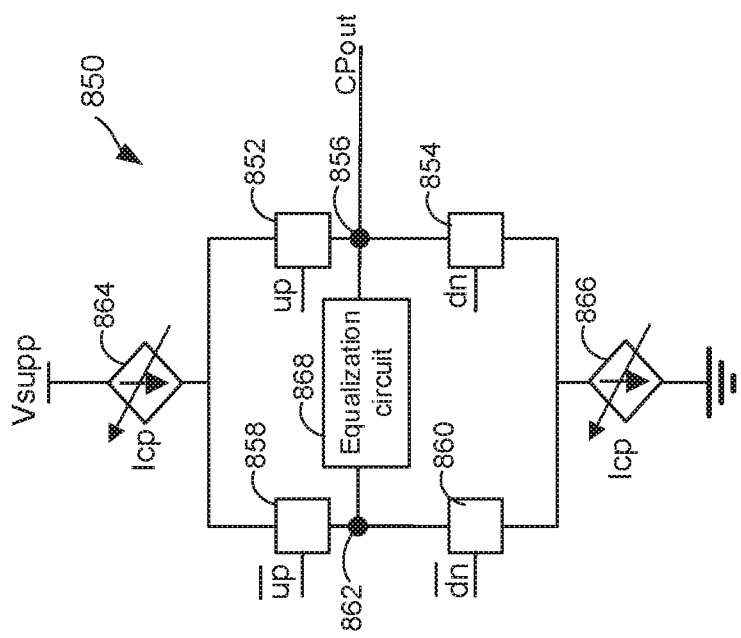

FIG. 8B shows a conceptual illustration of operation of charge pump 850 when it is not pulling voltage of first node 856 up or down (e.g. when "up" signal on up signal line 721 and "dn" signal on down signal line 723 both provide a first or low input that does not turn switches on). This may occur when no correction is required to the output of VCO 728. First pull-up switch 852 and first pull-down switch 854 are off at this time so that no current flows through the first branch. Because signals "up" and "dn" are not configured to turn switches on (e.g. providing a first input) their inverses ("$\overline{up}$" and "$\overline{dn}$") are configured to turn switches on (e.g. providing a second input) so that second pull-up switch 858 and second pull-down switch 860 are both on. Current Icp provided by first current source 864 flows through the first branch: through second pull-up switch 858, second node 862, second pull-down switch 860, and through second current source 866 as conceptually illustrated by dotted line 870. Thus, current Icp is steered through the second branch at this time without affecting voltage at the output node or driving any current on output CPout. Current Icp flows through first current source 864 and second current source 886 so that both current sources maintain their target current at this time.

Figure 8D:
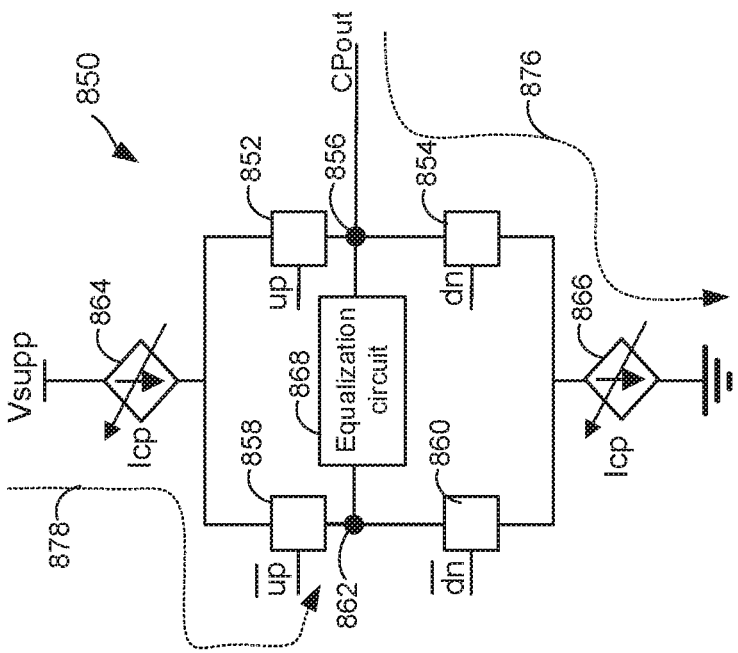
Figure 8C:
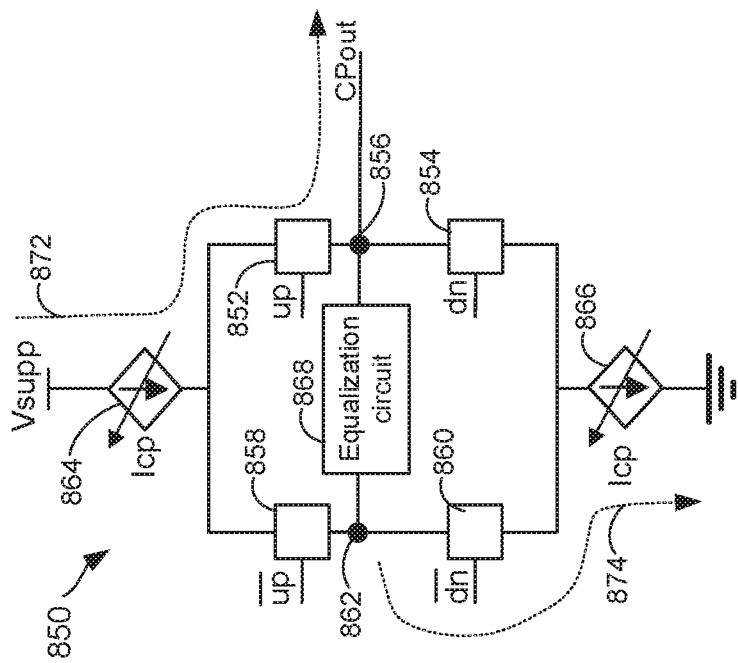

FIG. 8C shows a conceptual illustration of an example of current flow in a pull-up phase of charge pump 850 when first pull-up switch 852 is on (e.g. "up" signal on up signal line 721 from PFD 722 is high). First current source 864 generates current Icp which flows through first current source 864, through first pull-up switch 852 and provides the output current of charge pump 850 (CPout, which goes through filter 726 to VC0728). This flow is illustrated conceptually by dotted line 872. Second pull-up switch 858 is off at this time so that no current flows from first current source 864 into the second branch. First pull-down switch 854 is also off at this time so that no current flows from the first branch to second current source 866 and ground. When first pull-up switch 852 is on and first pull-down switch 854 is off, the voltage at first node 856 is pulled up (i.e. voltage increases closer to Vsupp). In response, equalization circuit 868 attempts to raise the voltage of second node 862. Equalization circuit 868 provides current at second node 862, which flows through second pull-down switch 860 and second current source 866 to ground as illustrated conceptually by dotted line 874. In general, to compensate for an increase in voltage at first node 856 caused by flow of current Icp, equalization circuit 868 provides a current of Icp at second node 862 so that current Icp flows through second current source 866 at this time. Thus, first current source 864 and second current source 866 maintain their target current Icp at this time (e.g. during pull-up phase).

FIG. 8D shows a conceptual illustration of an example of current flow in a pull-down phase of charge pump 850 when first pull-down switch 854 is on (e.g. "dn" signal on down signal line 723 from PFD 722 is high). Second current source 866 sinks current Icp which flows from first node 856 (and output of charge pump 850), through first pull-down switch 854 and second current source 866 as conceptually illustrated by dotted line 876. Second pull-down switch 860 is turned off at this time so that no current flows from the second branch to second current source 866. First pull-up switch 852 is also off at this time so that no current flows from the first current source 864 to first node 856. When first pull-down switch 854 is on and first pull-up switch 852 is off, the voltage at first node 856 is pulled down (i.e. voltage decreases closer to 0 volts or ground). In response, equalization circuit 868 attempts to lower the voltage of second node 862. Equalization circuit 868 sinks current at second node 862. This current flows through first current source 864 and second pull-up switch 858 as illustrated conceptually by dotted line 878. In general, to compensate for a drop in voltage at first node 856 caused by flow of current Icp from first node 856, equalization circuit 868 sinks a current of Icp at second node 862 so that current Icp flows through first current source 864 at this time. Thus, first current source 864 and second current source 866 maintain their target current Icp at this time (e.g. during pull-down phase). Charge pump 850 may be considered as an example of a current steering charge pump.

Figure 9:
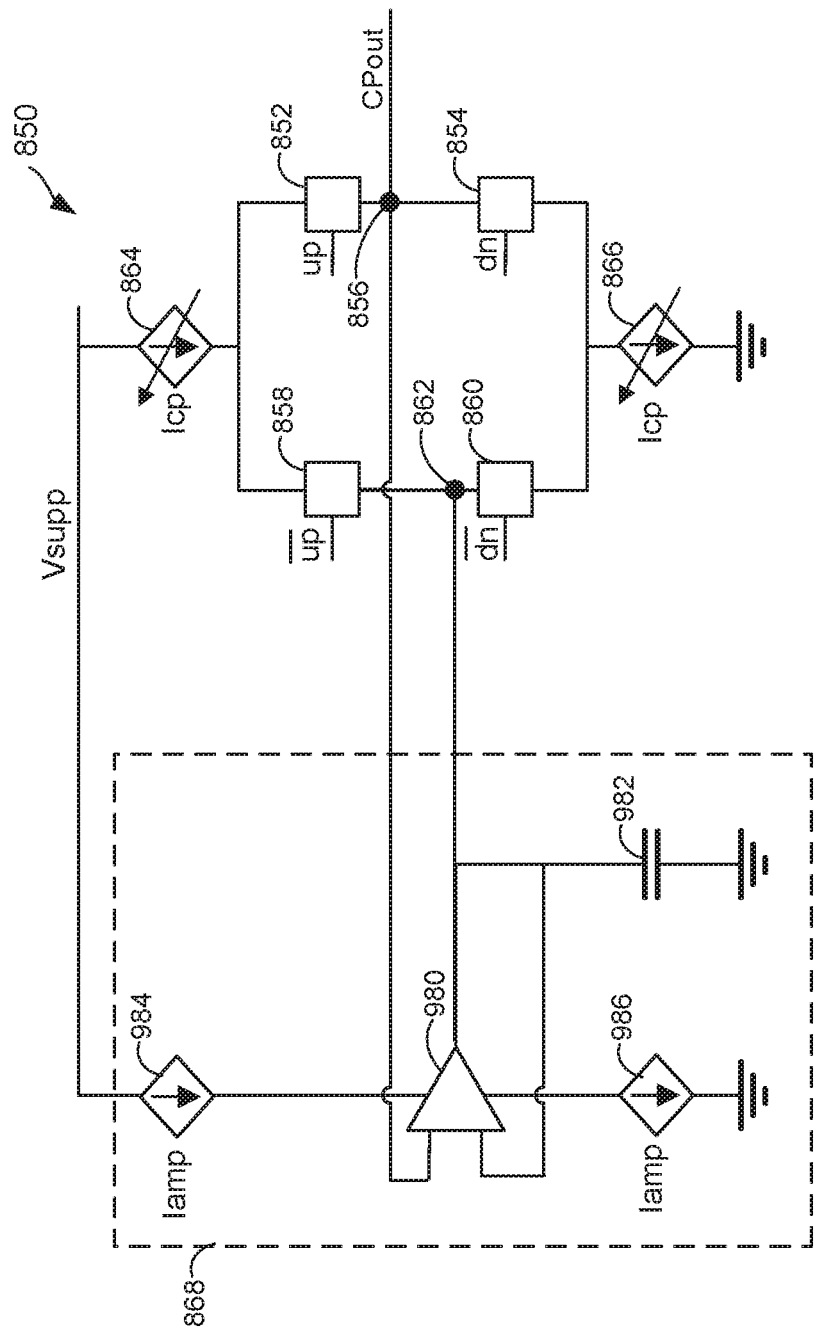
FIG. 9 illustrates an example of a current steering charge pump with an equalization circuit that includes an op-amp in a voltage follower configuration.

FIG. 9 illustrates an example of charge pump 850 with equalization circuit 868 implemented by components that include an op-amp 980 (operational amplifier) in a voltage follower configuration. The output of op-amp 980 is connected to second node 862. A first input of op-amp 980 is connected to first node 856 and a second input of op-amp 980 is connected to second node 862 (connected to the output of op-amp 980) and to capacitor 982, which is connected between op-amp 980 and ground. Op-amp 980 is connected to a first op-amp current source 984 and a second op-amp current source 986, which allow op-amp 980 to provide and sink current as needed to equalize voltage at first node 856 and second node 862 (e.g. by supplying/sinking current as needed). For example, first op-amp current source 984 and second op-amp current source 986 may be configured to provide/sink an op-amp current, Iamp, that is sufficient so that op-amp 980 is capable of supplying/sinking Icp for charge pump 850. Iamp may be somewhat more than Icp to provide additional current for operation of op-amp 980 and for any loss. For example, Tamp may be 10% more or 20% more than Icp (Iamp=1.1*Icp, or Iamp=1.2*Icp).

In some cases, Icp may be configurable so that a charge pump such as charge pump 850 can provide current at different levels. For example, some interface circuits may be configurable to operate with different interface requirements (e.g. as specified in an interface standard or specification). This may allow an interface circuit of, for example, an ASIC in a memory system, to be configured to interface with different hosts that may use different interface protocols or standards. Interface circuits may be configured in a one-time configuration process or may be reconfigurable more than once. In some cases, different interface protocols may require different clock signals (e.g. different frequencies and/or amplitudes). A PLL used to generate such clock signals for an interface may be configurable to generate such different signals (e.g. to generate high frequency clock signals from 6 GHz to 10 GHz from a 25 MHz reference clock signal). A charge pump in a PLL in such interface circuits may be configurable to generate an output at different current levels to accommodate such configurability. In some cases, this may require a charge pump to be configurable to provide a wide range of current outputs, for example at a configurable level from 25 uA to 750 uA, or in some cases up to 1.5 mA or more. One of more current sources in a current steering charge pump may be configurable and may be preconfigured (e.g. during an initialization procedure) so that preconfigured current sources provide appropriate current for a given interface.

Where a charge pump such as charge pump 850 is used to provide a wide range of current outputs (e.g. Icp from 25 uA to 750 uA), one option is to configure the op-amp for the highest current that might be required. For example, Tamp may be configured for 750 uA, e.g. Iamp=1.1*750=825 uA. However, when the interface circuit requires a lower current (e.g. 25 uA) this may be wasteful and inefficient. Another option is to configure Tamp according to the requirement for Icp. However, this may cause the op-amp's gain, bandwidth and pole location to change and may make stabilization difficult. It may also require a large capacitance (e.g. capacitance of capacitor 982 may be large) in order to maintain a minimum phase margin across all current options. This may result in a significant penalty in area required and time for design and simulation. According to aspects of the present technology, output current of a charge pump may be configurable over a wide range of current without requiring such large op-amp current or reconfiguring op-amp current for different charge pump current outputs.

Figure 10A:
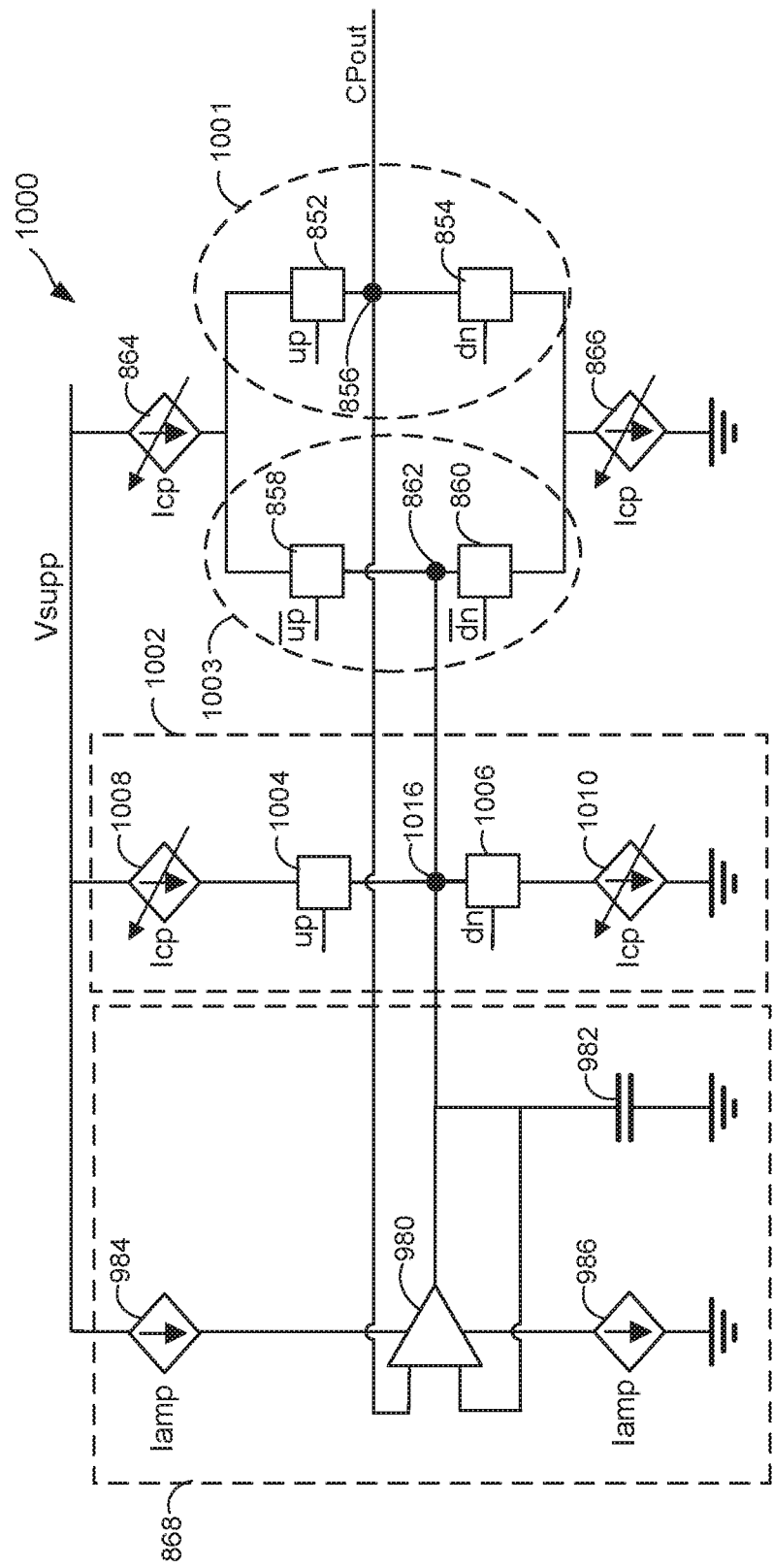
FIGS. 10A-D illustrate examples of operation of a current steering charge pump that includes a third branch.

FIG. 10A illustrates an example of a charge pump 1000 that is configurable to provide a wide range of current output (e.g. Icp from 25 uA to 750 uA). Charge pump 1000 is configurable to provide different output currents, Icp, without changing the current to the op-amp (op-amp current), Tamp, which may be relatively small (e.g. less than the maximum current level or maximum value of Icp: 750 uA in this example). Charge pump 1000 may be used like charge pump 850 (e.g. used to implement charge pump 724 in PLL 720 in interface circuit 150). Charge pump 1000 includes certain components that are common to charge pump 850, which are not described again with respect to FIG. 10, and the same reference numbers are used for such common features. For example, first pull-up switch 852 and first pull-down switch 854 form a first branch 1001 and second pull-up switch 858 and second pull-down switch 860 form a second branch 1003 that extend in parallel between first current source 864 and second current source 866 as previously described. In addition to these branches, charge pump 1000 includes third branch 1002, which includes a third pull-up switch 1004 and a third pull-down switch 1006. Third pull-up switch 1004 is controlled by "up" signal (e.g. received on up signal line 721) so that third pull-up switch 1004 is controlled by the same common pull-up signal as first pull-up switch 852. The third branch 1002 also includes a third pull-down switch 1006 that is controlled by "dn" signal (e.g. received on down signal line 723) so that third pull-down switch 1006 is controlled by the same common pull-down signal as first pull-down switch 854. Third node 1016 is between third pull-up switch 1004 and third pull-down switch 1006 and is connected to second node 862 (second node 862 and third node 1016 are directly connected and may be considered a common node). Third branch 1002 also includes a third current source 1008 between supply voltage Vsupp and third pull-up switch 1004 and a fourth current source 1010 between third pull-down switch 1006 and ground. Third current source 1008 and fourth current source 1010 are configurable current sources to provide/sink the same current, Icp, as first current source 864 and second current source 866 (also configurable current sources). Providing/sinking a configurable charge pump current Icp through third branch 1002, allows op-amp 980 to operate at a fixed current that may be smaller than one or more values of Icp. For example, where Icp has a range of 25 uA to 750 uA, Tamp may be set to operate at 50 uA regardless of Icp (e.g. may not be configurable for a different current level).

Figure 10B:
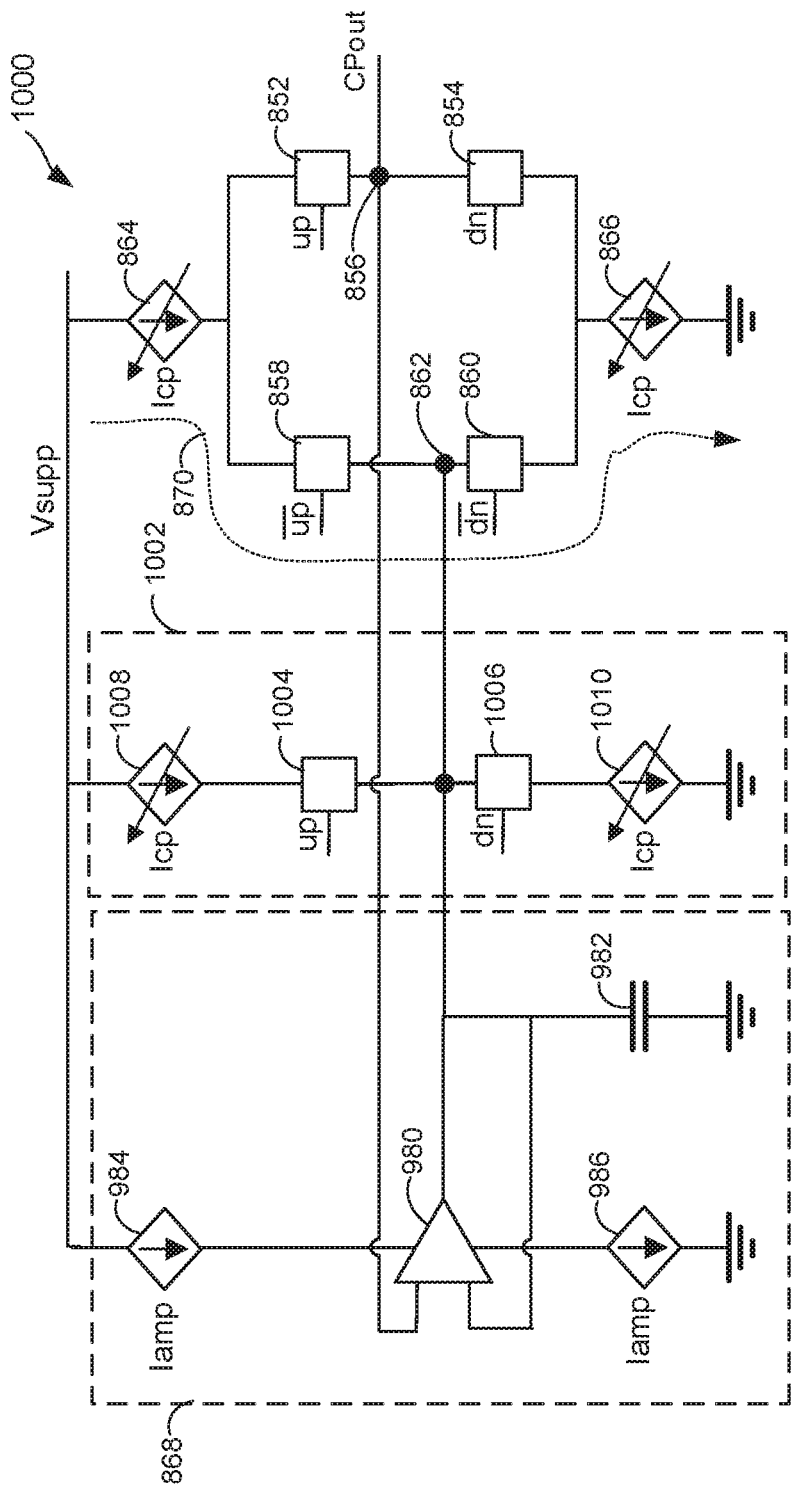

FIG. 10B shows a conceptual illustration of operation of charge pump 1000 when it is not pulling voltage of first node 856 up or down (e.g. when it does not receive an "up" signal on up signal line 721 and does not receive a "dn" signal on down signal line 723). This may occur when no correction is required to the output of VCO 728. First pull-up switch 852 and first pull-down switch 854 are off at this time so that no current flows through the first branch. Similarly, third pull-up switch 1004 and third pull-down switch 1006, which are controlled by common pull-up and pull-down signals, provide a first input corresponding to an off condition at this time so that no current flows through third branch 1002. Because common pull-up and pull-down signals "up" and "dn" provide the first input corresponding to off, the inverse of common pull-up signal ("$\overline{up}$") and the inverse of common pull-down signal ("$\overline{dn}$") provide a second input corresponding to an on condition so that second pull-up switch 858 and second pull-down switch 860 are both on. Current Icp provided by first current source 864 flows through the second branch: through second pull-up switch 858, second node 862, second pull-down switch 860, and through second current source 866 as conceptually illustrated by dotted line 870 and as previously illustrated with respect to charge pump 850 of FIG. 8B. Current Icp flows through first current source 864 and second current source 886 so that both current sources maintain their target current at this time.

Figure 10C:
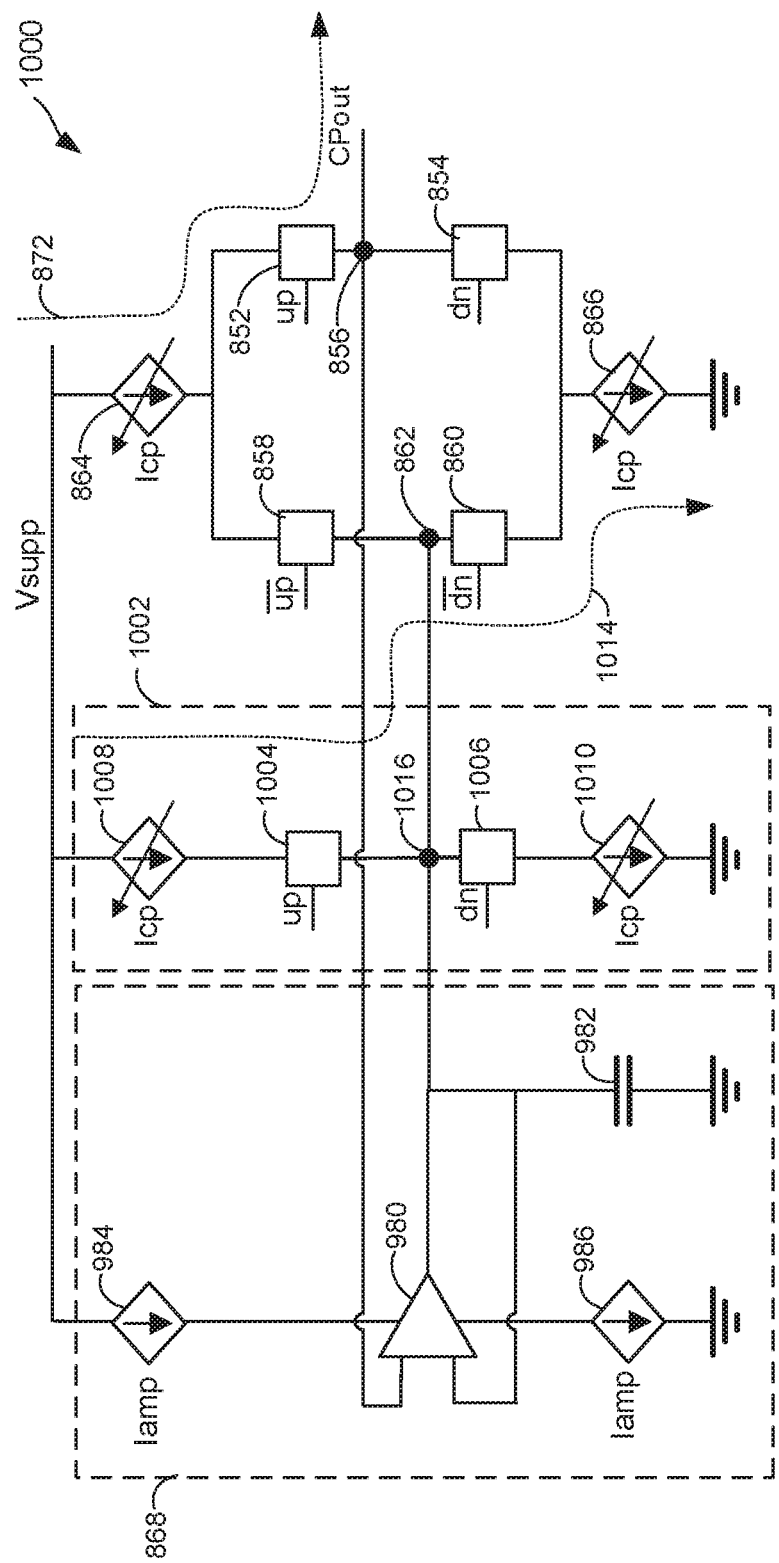

FIG. 10C shows a conceptual illustration of an example of current flow in a pull-up phase of charge pump 850 when first pull-up switch 852 is on (e.g. "up" signal on up signal line 721 from PFD 722 provides a second input corresponding to on condition). First current source 864 generates current Icp which flows through first current source 864, through first pull-up switch 852 and provides the output current of charge pump 850 (CPout, which goes through filter 726 to VC0728). This flow is illustrated conceptually by dotted line 872, which is similar to current flow through these components in charge pump 850 shown in FIG. 8C. Second pull-up switch 858 is off at this time so that no current flows from first current source 864 into the second branch. First pull-down switch 854 is also off at this time so that no current flows from the first branch to second current source 866 and ground. Third pull-up switch 1004 is switched on at this time (by "up" signal that is common to first pull-up switch 852). This allows current flow along the pathway conceptually illustrated by dotted line 1014, through third current source 1008, third pull-up switch 1004, third node 1016, second node 862, second pull-down switch 860, and second current source 866. Thus, instead of equalization circuit 868 providing current Icp to second pull-down switch 860 and second current source 866 as shown in charge pump 850 of FIG. 8C, in charge pump 1000, current Icp is provided through the third branch (through third current source 1008 and third pull-up switch 1004). This means that op-amp 980 may be configured to operate at a relatively low current (e.g. Tamp may be less than Icp, at least in some configurations). This also allows configuration of charge pump 1000 for a range of different currents Icp without change to the current Tamp used by op-amp 980.

Figure 10D:
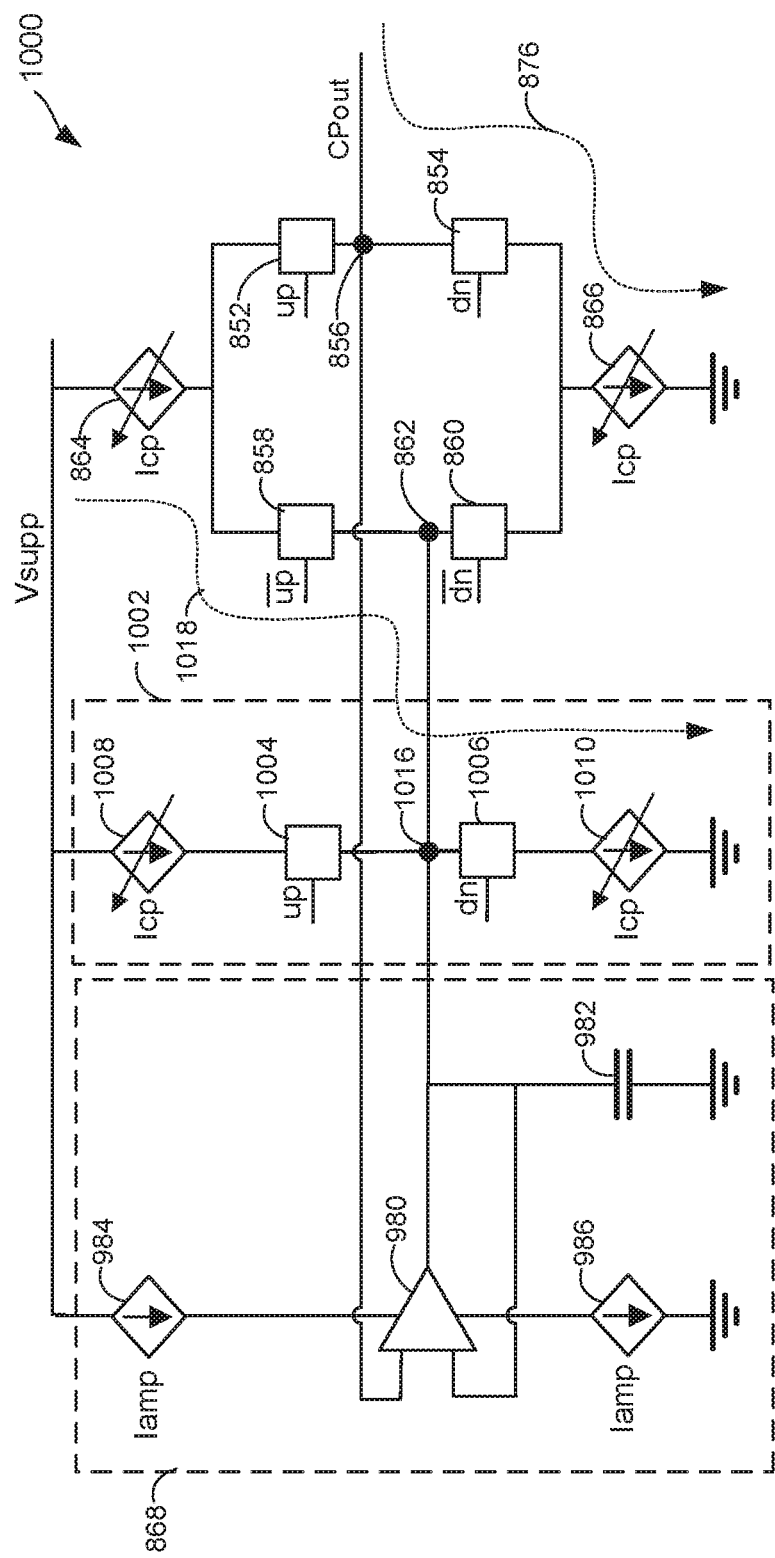

FIG. 10D shows a conceptual illustration of an example of current flow in a pull-down phase of charge pump 1000 when first pull-down switch 854 is on (e.g. "dn" signal on down signal line 723 from PFD 722 provides a second input corresponding to on condition). Second current source 866 sinks current Icp which flows from first node 856 (and output of charge pump 850), through first pull-down switch 854 and second current source 866 as conceptually illustrated by dotted line 876. Second pull-down switch 860 is turned off at this time so that no current flows from the second branch to second current source 866. First pull-up switch 852 is also off at this time so that no current flows from the first current source 864 to first node 856. Third pull-down switch 1006 is switched on at this time (by "dn" signal that is common to first pull-down switch 854). This allows current flow along the pathway conceptually illustrated by dotted line 1018, through first current source 864, second pull-up switch 858, second node 862, third node 1016, third pull-down switch 1006, and fourth current source 1010. Thus, instead of equalization circuit 868 sinking current Icp from second pull-up switch 858 and first current source 864 as shown in charge pump 850 of FIG. 8D, in charge pump 1000, current Icp is sunk through the third branch 1002 (through third pull-down switch 1006 and fourth current source 1010). This means that op-amp 980 may be configured to operate at a relatively low current (e.g. Tamp may be less than Icp, at least in some configurations).

This also allows configuration of charge pump 1000 for a range of different currents Icp without change to the current Tamp used by op-amp 980. Op-amp may be configured to provide/sink relatively small currents that may result from imbalance as switches turn on/off or other transient conditions occur while the larger current Icp is provided by third branch 1002. Third branch 1002 may be considered as a means for providing current at a first current level to the second node in a pull-up phase of the current steering charge pump and for sinking current at the first current level from the second node in a pull-down phase of the current steering charge pump (e.g. providing Icp to second node 862 in the pull-up phase shown in FIG. 10C and sinking Icp from second node 862 in the pull-down phase shown in FIG. 10D).

Figure 11:
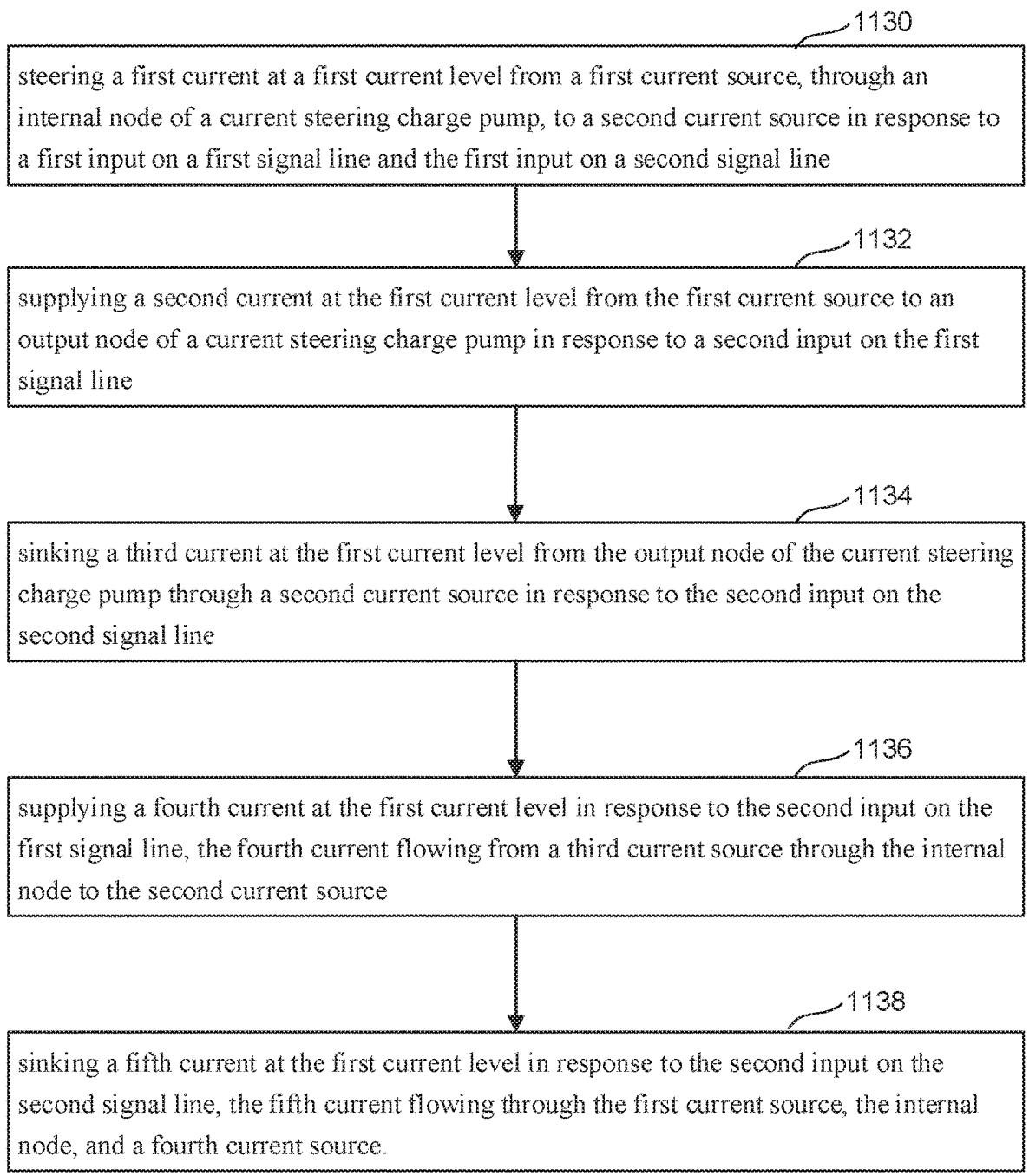
FIG. 11 illustrates a method according to an example of the present technology.

FIG. 11 illustrates an example of a method that includes steering a first current at a first current level from a first current source, through an internal node of a current steering charge pump, to a second current source in response to a first input on a first signal line and the first input on a second signal line 1130 (e.g. steering current Icp from first current source 864 through second node 862 and second current source 866 as shown by dotted line 870 in FIG. 10B), supplying a second current at the first current level from the first current source to an output node of a current steering charge pump in response to a second input on the first signal line 1132 (e.g. Icp to node 856 as shown by dotted line 872 in FIG. 10C), and sinking a third current at the first current level from the output node of the current steering charge pump through a second current source in response to the second input on the second signal line 1134 (e.g. Icp from first node 856 through second current source 866 as shown by dotted line 876 of FIG. 10D). The method further includes supplying a fourth current at the first current level in response to the second input on the first signal line, the fourth current flowing from a third current source through the internal node to the second current source 1136 (e.g. Icp from third current source through second node 862 to second current source 866 as shown by dotted line 1014 in FIG. 10C) and sinking a fifth current at the first current level in response to the second input on the second signal line, the fifth current flowing through the first current source, the internal node, and a fourth current source 1138 (e.g. Icp from first current source 864, second node 862, and fourth current source 1010 as shown by dotted line 1018 in FIG. 10D).

An example of a charge pump includes a first branch that includes a first node connected between a first pull-up switch and a first pull-down switch, a second branch that includes a second node connected between a second pull-up switch and a second pull-down switch, the second branch is connected in parallel with the first branch, a voltage equalization circuit to equalize a first voltage at the first node and a second voltage at the second node, and a third branch that includes a third node connected between a third pull-up switch and a third pull-down switch, the third node connected to the second node, the third pull-up switch and the first pull-up switch are controlled by a common pull-up signal, and the third pull-down switch and the first pull-down switch are controlled by a common pull-down signal.

The voltage equalization circuit may include an op-amp in a voltage follower configuration having a first input connected to the first node, a second input connected to the second node, and an output connected to the second node. The voltage equalization circuit may further include a capacitor connected between the output of the op-amp and ground. The second pull-up switch may be controlled by the inverse of the common pull-up signal and the second pull-down switch is controlled by the inverse of the common pull-down signal. The charge pump may further include a first current source connected between a supply voltage and the first and second pull-up switches and a second current source connected between the first and second pull-down switches and ground. The charge pump may further include a third current source connected between the supply voltage and the third pull-up switch and a fourth current source connected between the third pull-down switch and ground. The first, second, third, and fourth current sources may each be configured to generate a first current. Each of the first, second, third, and fourth current sources may be configurable to generate the first current at a configurable level from 25 uA to 750 uA. The charge pump may further include a fifth current source connected between the supply voltage and an op-amp of the voltage equalization circuit and a sixth current source connected between the op-amp of the voltage equalization circuit and ground. Each of the first, second, third, and fourth current sources may be configurable to generate current at a configurable level from 25 uA to 750 uA and the fifth and sixth current sources may be preconfigured to generate an op-amp current at a level that is less than 750 uA. The first node may be connected to a Voltage Controlled Oscillator (VCO) of a Phase Locked Loop (PLL) to provide voltage control of frequency of a signal generated by the VCO and the first pull-up switch, the second pull-up switch, the third pull-up switch, the first pull-down switch, the second pull-down switch, and the third pull-down switch may be controlled by signals from a Phase/Frequency Detector (PFD) of the PLL.

An example of a system includes a Phase Locked Loop (PLL) configured to receive a reference signal having a reference frequency and generate an output signal at an output frequency that is a multiple of the reference frequency, the PLL including a current steering charge pump configured to generate a phase correction current that is proportional to a phase difference between a reference signal and an output signal. The current steering charge pump includes an op-amp configured in a voltage follower configuration between an internal node and an output node of the current steering charge pump, the output node connected between a first pull-up switch controlled by an up signal and a first pull-down switch controlled by a down signal, the internal node connected between a second pull-up switch controlled by the inverse of the up signal and a second pull-down switch controlled by the inverse of the down signal and a third pull-up switch connected to the internal node and a third pull-down switch connected to the internal node, the third pull-up switch controlled by the up signal and the third pull-down switch controlled by the down signal.

The current steering charge pump may further include a plurality of configurable current sources connected to the first pull-up switch, the second pull-up switch, the third pull-up switch, the first pull-down switch, the second pull-down switch, and the third pull-down switch, the configurable current sources are configurable to generate a charge pump output current at a range of current levels and a plurality of preconfigured current sources connected to the op-amp to supply the op-amp with a fixed current that is less than a maximum current level of the charge pump output.

The PLL may further include a Voltage Controlled Oscillator (VCO) configured to generate a VCO output signal at a frequency that is proportional to a VCO input voltage received from the output node of the current steering charge pump, a frequency divider connected to receive the VCO output signal and generate a divided frequency signal at a frequency that is a predetermined fraction of the frequency of the VCO output signal, and a Phase/Frequency Detector (PFD) connected to the frequency divider to receive the divided frequency signal, the PFD configured to generate a PFD output signal that includes digital pulses having pulse width that is proportional to phase difference between the divided frequency signal and the reference signal. The reference signal may be a reference clock signal and the output signal may be a clock signal for an interface between a memory system and a host, the current steering charge pump may be configurable to generate a charge pump output current at a plurality of different current levels according to a plurality of different interface standards. The plurality of different current levels may include a first current level for a PCIe interface standard, a second current level for SATA interface standard, and a third current level for USB interface standard. The memory system may be a solid state drive. The memory system may include a memory structure formed on a memory die and control circuitry including the PLL formed on a control circuit die that is bonded to the memory die to form an integrated memory assembly.

An example of a method includes steering a first current at a first current level from a first current source, through an internal node of a current steering charge pump, to a second current source in response to a first input on a first signal line and the first input on a second signal line, supplying a second current at the first current level from the first current source to an output node of a current steering charge pump in response to a second input on the first signal line and sinking a third current at the first current level from the output node of the current steering charge pump through a second current source in response to the second input on the second signal line. The method further includes supplying a fourth current at the first current level in response to the second input on the first signal line, the fourth current flowing from a third current source through the internal node to the second current source and sinking a fifth current at the first current level in response to the second input on the second signal line, the fifth current flowing through the first current source, the internal node, and a fourth current source.

The method may further include equalizing voltage at the output node and the internal node. Equalizing voltage at the output node and the internal node may include operating an op-amp in a voltage follower configuration connected between the output node and the internal node. Operating the op-amp in the voltage follower configuration may include providing current to the op-amp at a second current level, the second current level is less than the first current level.

An example of a circuit includes a first current steering charge pump branch that includes a first node connected between a first pull-up switch and a first pull-down switch, a second current steering charge pump branch that includes a second node connected between a second pull-up switch and a second pull-down switch, the second current steering charge pump branch is connected in parallel with the first branch between a first current source and a second current source, the first and second current sources each configured for a current at a first current level, an op-amp in a voltage follower configuration having a first input connected to the first node, a second input connected to the second node, and an output connected to the second node, and means for providing current at the first current level to the second node in a pull-up phase of the current steering charge pump and for sinking current at the first current level from the second node in a pull-down phase of the current steering charge pump.

The means for providing current at the first current level to the second node in a pull-up phase of the current steering charge pump and for sinking current at the first current level from the second node in a pull-down phase of the current steering charge pump may include a third current source configured for a current at the first current level a fourth current source configured for a current at the first current level.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A charge pump, comprising:
   a first branch that includes a first node connected between a first pull-up switch and a first pull-down switch;
   a second branch that includes a second node connected between a second pull-up switch and a second pull-down switch, the second branch is connected in parallel with the first branch;
   a first current source connected between a supply voltage and the first and second pull-up switches;
   a second current source connected between the first and second pull-down switches and ground;
   a voltage equalization circuit to equalize a first voltage at the first node and a second voltage at the second node; and
   a third branch that includes a third node connected between a third pull-up switch and a third pull-down switch, the third node connected to the second node, the third pull-up switch and the first pull-up switch are controlled by a common pull-up signal, and the third pull-down switch and the first pull-down switch are controlled by a common pull-down signal.

2. The charge pump of claim 1, wherein the voltage equalization circuit includes an op-amp in a voltage follower configuration having a first input connected to the first node, a second input connected to the second node, and an output connected to the second node.

3. The charge pump of claim 2 wherein, the voltage equalization circuit further includes a capacitor connected between the output of the op-amp and ground.

4. The charge pump of claim 1, wherein the second pull-up switch is controlled by the inverse of the common pull-up signal and the second pull-down switch is controlled by the inverse of the common pull-down signal.

5. The charge pump of claim 1 further comprising:
   a Voltage Controlled Oscillator (VCO) connected to the first node.

6. The charge pump of claim 5 further comprising:
   a third current source connected between the supply voltage and the third pull-up switch; and
   a fourth current source connected between the third pull-down switch and ground.

7. The charge pump of claim 6, wherein the first, second, third, and fourth current sources are each configured to generate a first current.

8. The charge pump of claim 7 wherein each of the first, second, third, and fourth current sources is configurable to generate the first current at a configurable level from 25 uA to 750 uA.

9. The charge pump of claim 6 further comprising:
   a fifth current source connected between the supply voltage and an op-amp of the voltage equalization circuit; and
   a sixth current source connected between the op-amp of the voltage equalization circuit and ground.

10. The charge pump of claim 9, wherein each of the first, second, third, and fourth current sources is configurable to generate current at a configurable level from 25 uA to 750 uA and the fifth and sixth current sources are preconfigured to generate an op-amp current at a level that is less than 750 uA.

11. The charge pump of claim 1, wherein the first node is connected to a Voltage Controlled Oscillator (VCO) of a Phase Locked Loop (PLL) to provide voltage control of frequency of a signal generated by the VCO and the first pull-up switch, the second pull-up switch, the third pull-up switch, the first pull-down switch, the second pull-down switch, and the third pull-down switch are controlled by signals from a Phase/Frequency Detector (PFD) of the PLL.

12. A system, comprising:
   a Phase Locked Loop (PLL) configured to receive a reference signal having a reference frequency and generate an output signal at an output frequency that is a multiple of the reference frequency, the PLL including a current steering charge pump configured to generate a phase correction current that is proportional to a phase difference between a reference signal and an output signal, the current steering charge pump including:
      an op-amp configured in a voltage follower configuration between an internal node and an output node of the current steering charge pump, the output node connected between a first pull-up switch controlled by an up signal and a first pull-down switch controlled by a down signal, the internal node connected between a second pull-up switch controlled by the inverse of the up signal and a second pull-down switch controlled by the inverse of the down signal; and
      a third pull-up switch connected to the internal node and a third pull-down switch connected to the internal node, the third pull-up switch controlled by the up signal and the third pull-down switch controlled by the down signal.

13. The system of claim 12, wherein the current steering charge pump further includes:
a plurality of configurable current sources connected to the first pull-up switch, the second pull-up switch, the third pull-up switch, the first pull-down switch, the second pull-down switch, and the third pull-down switch, the configurable current sources are configurable to generate a charge pump output current at a range of current levels; and
a plurality of preconfigured current sources connected to the op-amp to supply the op-amp with a fixed current that is less than a maximum current level of the charge pump output.

14. The system of claim 12, wherein the PLL further includes:
a Voltage Controlled Oscillator (VCO) configured to generate a VCO output signal at a frequency that is proportional to a VCO input voltage received from the output node of the current steering charge pump;
a frequency divider connected to receive the VCO output signal and generate a divided frequency signal at a frequency that is a predetermined fraction of the frequency of the VCO output signal; and
a Phase/Frequency Detector (PFD) connected to the frequency divider to receive the divided frequency signal, the PFD configured to generate a PFD output signal that includes digital pulses having pulse width that is proportional to phase difference between the divided frequency signal and the reference signal.

15. The system of claim 12, wherein the reference signal is a reference clock signal and the output signal is a clock signal for an interface between a memory system and a host, the current steering charge pump is configurable to generate a charge pump output current at a plurality of different current levels according to a plurality of different interface standards.

16. The system of claim 15, wherein the plurality of different current levels includes a first current level for a PCIe interface standard, a second current level for SATA interface standard, and a third current level for USB interface standard.

17. The system of claim 15 wherein the memory system is a solid state drive.

18. The system of claim 15, wherein the memory system includes a memory structure formed on a memory die and control circuitry formed on a control die that is bonded to the memory die to form an integrated memory assembly.

19. A method, comprising:
steering a first current at a first current level from a first current source, through an internal node of a current steering charge pump, to a second current source in response to a first input on a first signal line and the first input on a second signal line;
supplying a second current at the first current level from the first current source to an output node of the current steering charge pump in response to a second input on the first signal line;
sinking a third current at the first current level from the output node of the current steering charge pump through a second current source in response to the second input on the second signal line;
supplying a fourth current at the first current level in response to the second input on the first signal line, the fourth current flowing from a third current source through the internal node to the second current source; and
sinking a fifth current at the first current level in response to the second input on the second signal line, the fifth current flowing through the first current source, the internal node, and a fourth current source.

20. The method of claim 19, further comprising equalizing voltage at the output node and the internal node.

21. The method of claim 20, wherein equalizing voltage at the output node and the internal node includes operating an op-amp in a voltage follower configuration connected between the output node and the internal node.

22. The method of claim 21, wherein operating the op-amp in the voltage follower configuration includes providing current to the op-amp at a second current level, the second current level is less than the first current level.

23. A circuit, comprising:
a first current steering charge pump branch that includes a first node connected between a first pull-up switch and a first pull-down switch;
a second current steering charge pump branch that includes a second node connected between a second pull-up switch and a second pull-down switch, the second current steering charge pump branch is connected in parallel with the first branch between a first current source and a second current source, the first and second current sources each configured for a current at a first current level;
an op-amp in a voltage follower configuration having a first input connected to the first node, a second input connected to the second node, and an output connected to the second node; and
means for providing current at the first current level to the second node in a pull-up phase of a current steering charge pump and for sinking current at the first current level from the second node in a pull-down phase of the current steering charge pump.

24. The circuit of claim 23, wherein the means for providing current at the first current level to the second node in a pull-up phase of the current steering charge pump and for sinking current at the first current level from the second node in a pull-down phase of the current steering charge pump includes a third current source configured for a current at the first current level and a fourth current source configured for a current at the first current level.

* * * * *